US006769551B2

(12) United States Patent
Rafferty et al.

(10) Patent No.: US 6,769,551 B2
(45) Date of Patent: Aug. 3, 2004

(54) SYSTEM AND METHOD FOR UTILIZING NON-DEDICATED RACK SPACE

(75) Inventors: Terrence Q. E. Rafferty, Salisbury, NC (US); Jason T. Runkle, Round Rock, TX (US); Corey D. Hartman, Round Rock, TX (US); Paul D. Higgins, Smithville, TX (US); Tiffany J. Williams, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 10/206,302

(22) Filed: Jul. 26, 2002

(65) Prior Publication Data

US 2004/0016708 A1 Jan. 29, 2004

(51) Int. Cl.[7] ................................................. A47F 5/00
(52) U.S. Cl. ...................... 211/26; 211/192; 361/683; 312/223.2
(58) Field of Search .................... 211/26, 192; 361/683; 312/223.2, 265.1, 265.4

(56) References Cited

U.S. PATENT DOCUMENTS

| | | | |
|---|---|---|---|
| 3,133,768 A | 5/1964 | Klakovich et al. ........... 308/3.6 |
| 3,680,711 A | 8/1972 | Brucker ................... 211/105.3 |
| 3,697,034 A | 10/1972 | Shell .......................... 248/243 |
| 4,184,726 A | 1/1980 | Cox ............................ 312/320 |
| 4,406,374 A | 9/1983 | Yedor .......................... 211/192 |
| 4,731,029 A | 3/1988 | Lerner et al. .................. 439/4 |
| 4,931,907 A | 6/1990 | Robinson et al. ........... 361/391 |
| 5,018,052 A | 5/1991 | Ammon et al. ............. 361/428 |
| 5,216,579 A | 6/1993 | Basara et al. ............... 361/383 |
| 5,460,441 A | 10/1995 | Hastings et al. ............ 312/298 |
| 5,505,533 A | 4/1996 | Kammersqard et al. .... 312/236 |
| 5,546,277 A | 8/1996 | Zandbergen |
| 5,571,256 A | * 11/1996 | Good et al. .................... 211/26 |
| 5,579,924 A | 12/1996 | Sands et al. ................... 211/26 |
| 5,655,738 A | 8/1997 | Ragsdale et al. .......... 248/68.1 |
| 5,684,671 A | 11/1997 | Hobbs et al. ............... 361/683 |
| 5,791,498 A | 8/1998 | Mills ............................ 211/26 |
| 5,833,337 A | 11/1998 | Kofstad ................... 312/334.5 |
| 5,850,925 A | 12/1998 | Gandre ........................ 211/26 |
| 5,884,609 A | 3/1999 | Kawamoto et al. ......... 123/520 |
| 5,890,602 A | 4/1999 | Schmitt ....................... 211/26 |
| 5,893,593 A | 4/1999 | Dowling .................. 292/336.3 |
| 5,921,402 A | 7/1999 | Magenheimer .............. 211/26 |

(List continued on next page.)

OTHER PUBLICATIONS

U.S.Pending patent Appl. Ser. No. 09/518,841 entitled "Rack Mount Slide System Enabling Front, Top and Rear Access to a Rack Mounted Device" by Baddour et al., assigned to Dell Products L..P. (DC–02172), filed Mar. 3, 2000.

(List continued on next page.)

Primary Examiner—Robert W. Gibson, Jr.
(74) Attorney, Agent, or Firm—Baker Botts L.L.P.

(57) ABSTRACT

An information handling system includes a rack operable to mount computer components therein. The rack includes multiple rack rails supported by a top support and a bottom support that define a rack space for housing components. The rack rails have both a first and second standard interface. The first standard interface facilitates the housing of components within a dedicated portion of the rack space while the second standard interface facilitates the housing of at least one component within a non-dedicated portion of the rack space. A component bracket is detachably coupled to a selected portion of the second standard interface of a rack rail. The component bracket supports a component within a portion of the non-dedicated portion of the rack space. The component bracket includes at least one hook and at least one latch mechanism that tool-lessly secures the component bracket to the second standard interface.

19 Claims, 6 Drawing Sheets

U.S. PATENT DOCUMENTS

| | | | |
|---|---|---|---|
| 5,941,621 A | 8/1999 | Boulay et al. | |
| 6,011,701 A | 1/2000 | Kopp et al. | 361/818 |
| 6,021,047 A | 2/2000 | Lopez et al. | 361/727 |
| 6,021,909 A | 2/2000 | Tang et al. | |
| 6,070,742 A | 6/2000 | McAnally et al. | 211/26 |
| 6,070,841 A | 6/2000 | Robinson | 248/220.43 |
| 6,070,957 A | 6/2000 | Zachrai | 312/334.4 |
| 6,071,742 A | 6/2000 | Tracy et al. | 435/320.1 |
| 6,076,198 A | 6/2000 | Meierdierck | 4/243.2 |
| 6,095,345 A | 8/2000 | Gibbons | 211/26 |
| 6,142,590 A | 11/2000 | Harwell | 312/223.1 |
| 6,181,549 B1 | 1/2001 | Mills et al. | 361/683 |
| 6,185,092 B1 | 2/2001 | Landrum et al. | 361/683 |
| 6,185,098 B1 | 2/2001 | Benavides | 361/695 |
| 6,223,908 B1 | 5/2001 | Kurtsman | 211/26 |
| 6,230,903 B1 | 5/2001 | Abbott | 211/26 |
| 6,273,534 B1 | 8/2001 | Bueley et al. | 312/334.8 |
| 6,297,962 B1 | 10/2001 | Johnson et al. | 361/726 |
| 6,303,864 B1 | 10/2001 | Johnson et al. | 174/69 |
| 6,305,556 B1 | 10/2001 | Mayer | 211/26 |
| 6,326,547 B1 | 12/2001 | Saxby et al. | 174/69 |
| 6,365,834 B1 | 4/2002 | Larsen et al. | 174/100 |
| 6,373,721 B2 | 4/2002 | Lecinski et al. | 361/826 |
| 6,398,041 B1 * | 6/2002 | Abbott | 211/26 |
| 6,398,149 B1 | 6/2002 | Hines et al. | 242/399 |
| 6,407,933 B1 | 6/2002 | Bolognia et al. | 361/826 |
| 6,422,399 B1 * | 7/2002 | Castillo et al. | 211/26 |
| 6,429,376 B1 | 8/2002 | Mendoza | 174/97 |
| 6,431,668 B1 * | 8/2002 | Reddicliffe | |
| 6,435,354 B1 | 8/2002 | Gray et al. | 211/26 |
| 6,554,142 B2 * | 4/2003 | Gray | 211/26 |
| 2003/0026084 A1 | 2/2003 | Lauchner | 361/826 |
| 2003/0123832 A1 | 7/2003 | Adapathya et al. | 385/135 |

OTHER PUBLICATIONS

U.S. Pending patent Appl. Ser. No. 08/881,289 entitled "Chassis Retaining System for an Electronics Rack" by Mills et al., assigned to Dell USA L.P. (Client No. DC–01275), filed Jun. 24, 1997.

U.S. Pending patent Appl. Ser. No. 09/470,280 entitled "Connector Arrangement and Connecting Method for Cable Management Arms", assigned to Dell USA L.P. (Client No. DC–02095), filed Dec. 22, 1999.

Figures filed in U.S.Pending patent Appl. Ser. No. 09/518, 841 entitled "Rack Mount Slide System Enabling Front, Top and Rear Access to a Rack Mounted Device" by Baddour et al., assigned to Dell Products L..P. (DC–02172), filed Mar. 3, 2000.

Figures filed in U.S. Pending patent Appl. Ser. No. 08/881, 289 entitled "Chassis Retaining System for an Electronics Rack" by Mills et al., assigned to Dell USA L.P. (Client No. DC–01275), filed Jun. 24, 1997.

Figures filed in U.S. Pending patent Appl. Ser. No. 09/470, 280 entitled "Connector Arrangement and Connecting Method for Cable Management Arms", assigned to Dell USA L.P. (Client No. DC–02095), filed Dec. 22, 1999.

U.S. Pending Patent Application Serial No. 10/675,102 entitled "Cable Management Flip Tray Assembly" by Daniel G. Lee, et al.; Dell Products L.P. (DC–04824).

U.S. Pending Patent Application Serial No. 10/393,620 entitled "Tool–less Cable Management Attachment Bracket and Method of Use" by Tiffany J. Williams; Dell Products L.P. (DC–03692).

U.S. Pending Patent Application Serial No. 10/278,263 entitled "System and Method for Rack Cable Management" by Corey D. Hartman, et al.; Dell Products L.P. (DC–03714).

Figures for U.S. Pending Patent Application Serial No. 10/393,620 entitled "Tool–less Cable Management Attachment Bracket and Method of Use" by Tiffany J. Williams; Dell Products L.P. (DC–03692).

Figures for U.S. Pending Patent Application Serial No. 10/278,263 entitled "System and Method for Rack Cable Management" by Corey D. Hartman, et al.; Dell Products L.P. (DC–03714).

Figures for U.S. Pending Patent Application Serial No. 10/675,102 entitled "Cable Management Flip Tray Assembly" by Daniel G. Lee, et al.; Dell Products L.P. (DC–04824).

Cabling Reference for the HP NetServer LXr Pro, Chapter 4, pp. 46–48.

IBM Magstar MP 3570 Tape Subsystem OPerator Guide C–Series Models "Installing the Rack–Mounted 3570" pp. 86–98.

IBM Magstar MP 3570 Tape Subsystem Operator Guide C–Series Models Attaching SCSI and Power Cables to Model C21 (Single Drive with Single Host) 1 p.

Compaq AlphaServer ES40 Rackmount System Installation Guide "Installing the Cable Management Arm, " pp. 18–21.

Compaq ProLiant DL360 Ultra–Dense Server Deployment in Compaq Racks "4.6.3.2. Sliding–Rail Cable Management" pp. 89–90.

Compaq ProLiant ML350 Tower–to–Rack Conversion Guide 2 pp.

J1478A–HP Cable Management Arm for LHx000r by Hewlett Packard 1 p.

Maintenance and Service Guide "illustrated Parts Catalog Chapter 1 –Illustrating the family of Compaq Rack–Mountable ProLiant 1500R Servers, " 3 pp.

Netra t1 and Netra st D130 Rackmount Installation Chapter 2 pp. 9–14.

* cited by examiner

SYSTEM AND METHOD FOR UTILIZING NON-DEDICATED RACK SPACE

TECHNICAL FIELD

This disclosure relates in general to the field of computers, and more particularly to computer racks, rack systems, and a system for utilizing non-dedicated rack space.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling system components are typically installed in a rack system, which may also be referred to as a "computer rack", or simply a "rack". Information handling system components including servers, processors, power supplies, storage devices such as disk drives, tape drives, and RAID drives, as well as other components may be installed in a rack system. Rack systems typically incorporate one or more standard interfaces for mounting components such as electronic industry association (EIA) recommended standard (RS) 310.

The vertical space within an EIA RS-310 compliant rack system is generally defined in vertical mounting unit increments, often referred to as "U's". A mounting unit or "U" is typically 1.75 inches. Interior rails of rack systems often have three mounting slots within each U of vertical space for attaching components. Rack systems and components are typically sized in mounting unit increments. For example, "2U" components are sized to fit within a 2U vertical space. "24U" and "72U" racks are sized to have 24U and 72U, respectively, of usable vertical space.

Computer components may be attached directly to the interior rails but more typically are attached to support arms connected to the rack rails. Often, a first support arm will be attached to the rails of one side of the rack while a second support arm is attached to the rails on the other side of the rack. A computer component may then be secured to the support arms. In some embodiments, the support arms include slides to allow the computer components to slide out from the rack to be accessed for maintenance, repair, or inspection.

In general terms, the space within a rack system may be divided into two types of space: the space dedicated for components connected to a EIA RS-310 compliant mounting interface or "dedicated space" (also known as "U-space") and non-dedicated space (also known as "zero-U space"). Non-dedicated or zero-U space is typically located along the top, bottom, back, and sides of the rack, while the dedicated space is generally located within the center of the rack. The non-dedicated rack space is sometimes used to house smaller components such as power distribution components and some switch components. However, such components are typically secured to the rack rails using loose fasteners which can prove to be time consuming and frustrating. Installation of components within the non-dedicated space is further hampered because non-dedicated rack space is often difficult to access, requiring the removal of external panels or the removal of components stored within the dedicated space. Accordingly, non-dedicated rack space is often poorly utilized.

SUMMARY

Therefore, a need has arisen for a system or method for facilitating the utilization of non-dedicated rack space.

A further need has arisen for a system or method for tool-lessly and releasably securing computer components to the non-dedicated rack space.

A further need has arisen for a system or method for using a releasable component mounting bracket that reduces installation and relocation times of computer components in the non-dedicated rack space.

In accordance with the teachings of the present invention, the disadvantages and problems associated with a component bracket have been substantially reduced or eliminated. In some embodiments of the present invention, an information handling system includes a rack able to mount components, such as computer system components. The rack includes multiple rack rails, typically four rack rails, supported by a top support and a bottom support. The rack rails have both a first and second standard interface. The rack rails, the top support, and the bottom support define a rack space for housing components. The first standard interface facilitates the housing of components within a dedicated portion of the rack space while the second standard interface facilitates the housing of at least one component within a non-dedicated portion of the rack space. A component bracket is detachably coupled to a selected portion of the second standard interface of a rack rail. The component bracket supports a component within a portion of the non-dedicated portion of the rack space. The component bracket includes at least one hook and at least one latch mechanism that tool-lessly secures the component bracket to the second standard interface.

In other embodiments, a component bracket for utilizing non-dedicated rack space includes a frame, a hook, and a depressible latch. The frame may support a computer component with the frame being able to mount the computer component in a non-dedicated portion of a rack. The hook may be formed on the frame. The hook engages with a first standard interface hole formed in the non-dedicated space of the rack. The depressible latch couples to the frame. The latch secures the frame to the rack such that the hook remains engaged with the first standard interface hole.

In further embodiments, a method for utilizing non-dedicated rack space may include providing a computer component coupled to a mounting bracket, where the mounting bracket includes a hook and a latching mechanism. The mounting bracket aligns with a standard interface slot or hole of a rack rail such that the component is stored within a non-dedicated space of a rack. The mounting bracket is preferably placed against the rack rail such that the hook protrudes through the interface hole. The mounting bracket may be secured to the rack rails by sliding the bracket along the rack rails until the hook releasably engages the rack rails and the latching mechanism tool-lessly and releasably engages another interface hole in the rack rail.

The present disclosure contains a number of important technical advantages. One technical advantage is providing a mounting bracket for tool-lessly mounting a component in the non-dedicated rack space. This increases the utilization of the non-dedicated rack space. Another technical advantage is providing a component bracket that utilizes a tool-less and releasable securing mechanism. This allow for the convenient and tool-less disposition of components in non-dedicated rack space and reduces times and effort associated with installing or relocating components within the non-dedicated rack space.

Other technical advantages will be apparent to one skilled in the art from the following figures, descriptions, and claims.

BRIEF DESCRIPTION OF THE DRAWINGS

A more complete understanding of the embodiments of the present disclosure and advantages thereof may be acquired by referring to the following description taken in conjunction with the accompanying drawings, in which like reference numbers indicate like features, and wherein.

DETAILED DESCRIPTION

Preferred embodiments of the present disclosure and their advantages are best understood by reference to FIGS. 1 through 7, where like numbers are used to indicate like and corresponding parts.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices, as well as various input and output (I/O) devices, such as a keyboard, a mouse, and a video display. The information handling system may also include one or more buses operable to transmit communications between the various hardware components.

Figure 1:
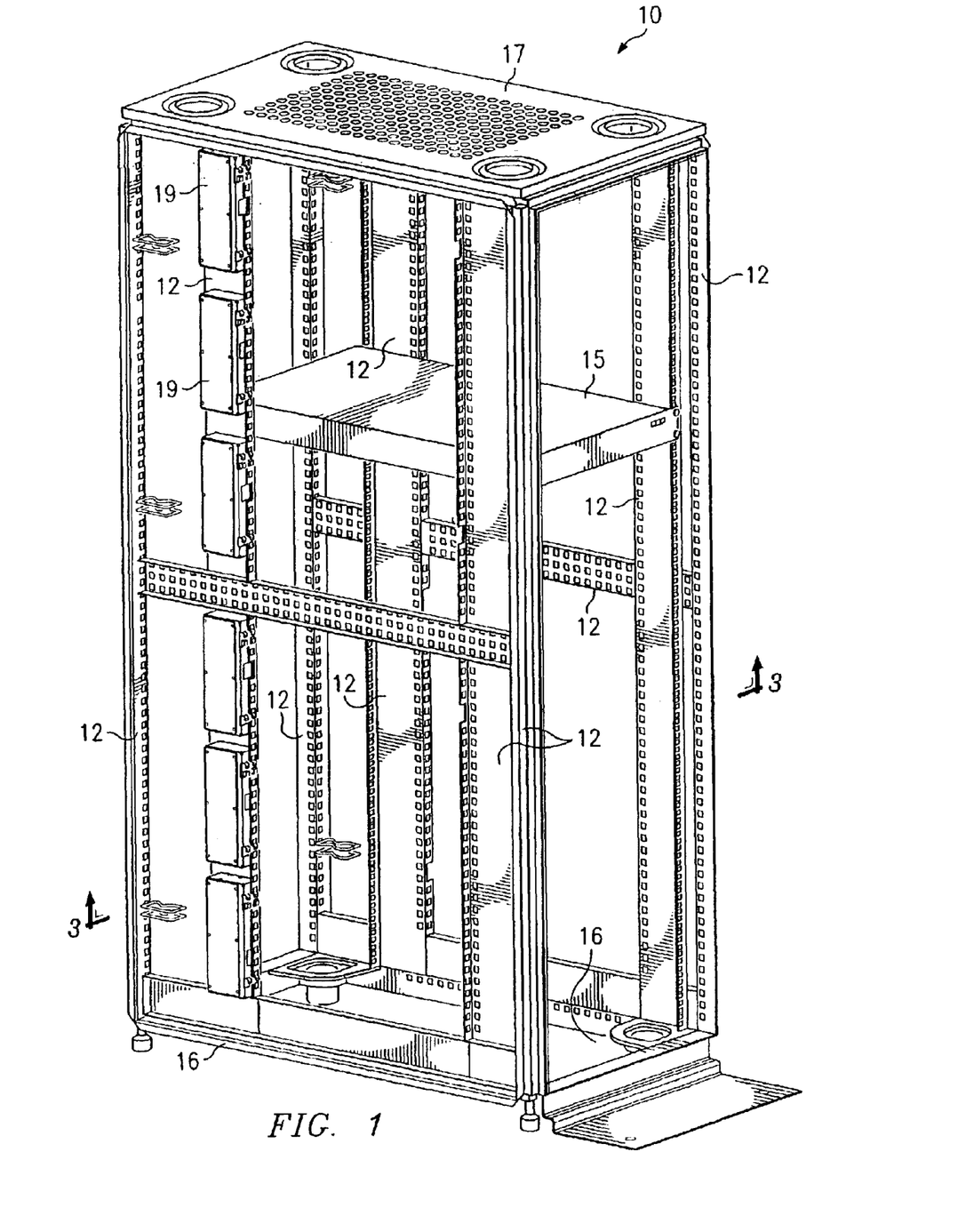
FIG. 1 illustrates a perspective view of a rack including plurality of rack rails and a top and a bottom support.

FIG. 1 illustrates a perspective view of an example embodiment of a rack indicated generally at 10. In the illustrated embodiment, rack 10 may include a plurality of rack rails 12, top 17, and bottom 16. Rack rails 12 are preferably disposed in a vertical position and connected to horizontally positioned top 17 and bottom 16. In alternate embodiments, rails 12 may be positioned substantially horizontally and supported by end components. Rack 10 may be arranged in a variety of configurations including, but not limited to, an open frame, an enclosed frame, and a stand-alone unit. Rack 10 preferably houses information handling system components 15 and 19. Rack 10 may be enclosed by enclosure panels (not expressly shown) and may further form a cabinet enclosure with varying depths and heights. Enclosure panels may include side panels, top panels, and bottom panels attached to the plurality of rack rails 12. Panels may be formed from any suitable material to enclose rack 10 within a cabinet. In one example embodiment, enclosure panels may be made from perforated metal plates to provide ventilation for components 15 and 19 placed within rack 10.

Because components 15 and 19 may add significant weight to rack 10, rack 10 may be formed from high strength members to support this additional weight. In one embodiment, rack 10 may be made of twelve-gauge steel to provide support for placing up to two thousand pounds of components 15 in rack rails 12.

Rack 10 may further include a variety of additional rail components (not expressly shown) such as side rails, cross rails, top rails, and bottom rails for providing additional support to rack 10.

Typically, rack rails 12 are used for mounting a variety of components to rack 10, such as components 15 and 19. In the present embodiment, component 15 is sized to be disposed in a dedicated or so-called U-space within rack 10. Components 19 are disposed in non-dedicated or Zero-U space within rack 10. Components 15 and/or 19 may include server, computer, disk drive, tape drive, raid drive, power distributions unit, switch, router, or other suitable components for use in an information handling system.

Figure 3:
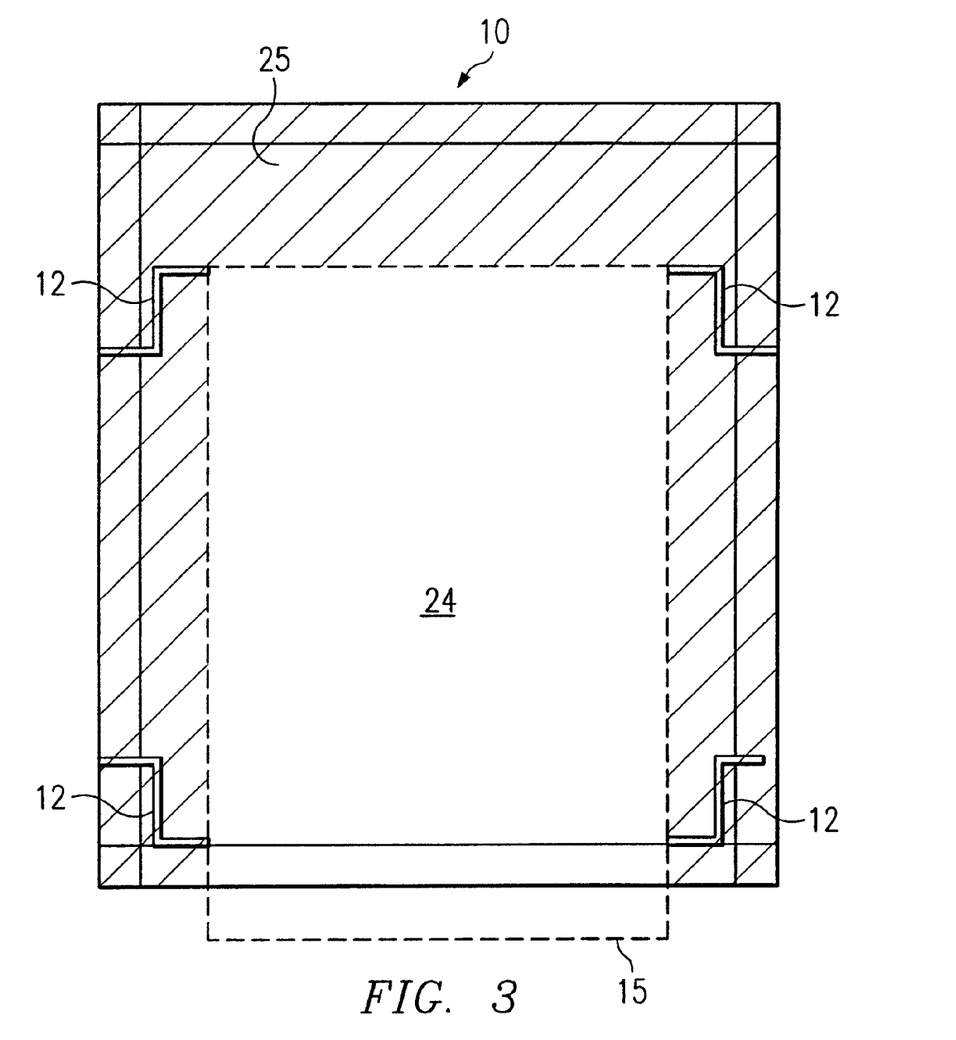
FIG. 3 is a cross sectional view of a rack illustrating dedicated space and non-dedicated space.

To aid in mounting component 15, rack rails 12 may include a first standard interface such as an EIA RS-310 standard compliant interface for mounting components within a dedicated portion of rack 10 (as shown in FIG. 3, below. In addition, rack 10 preferably includes a second standard interface, such as a 25 mm pitch interface for mounting components within non-dedicated portions of rack 10.

Figure 2:
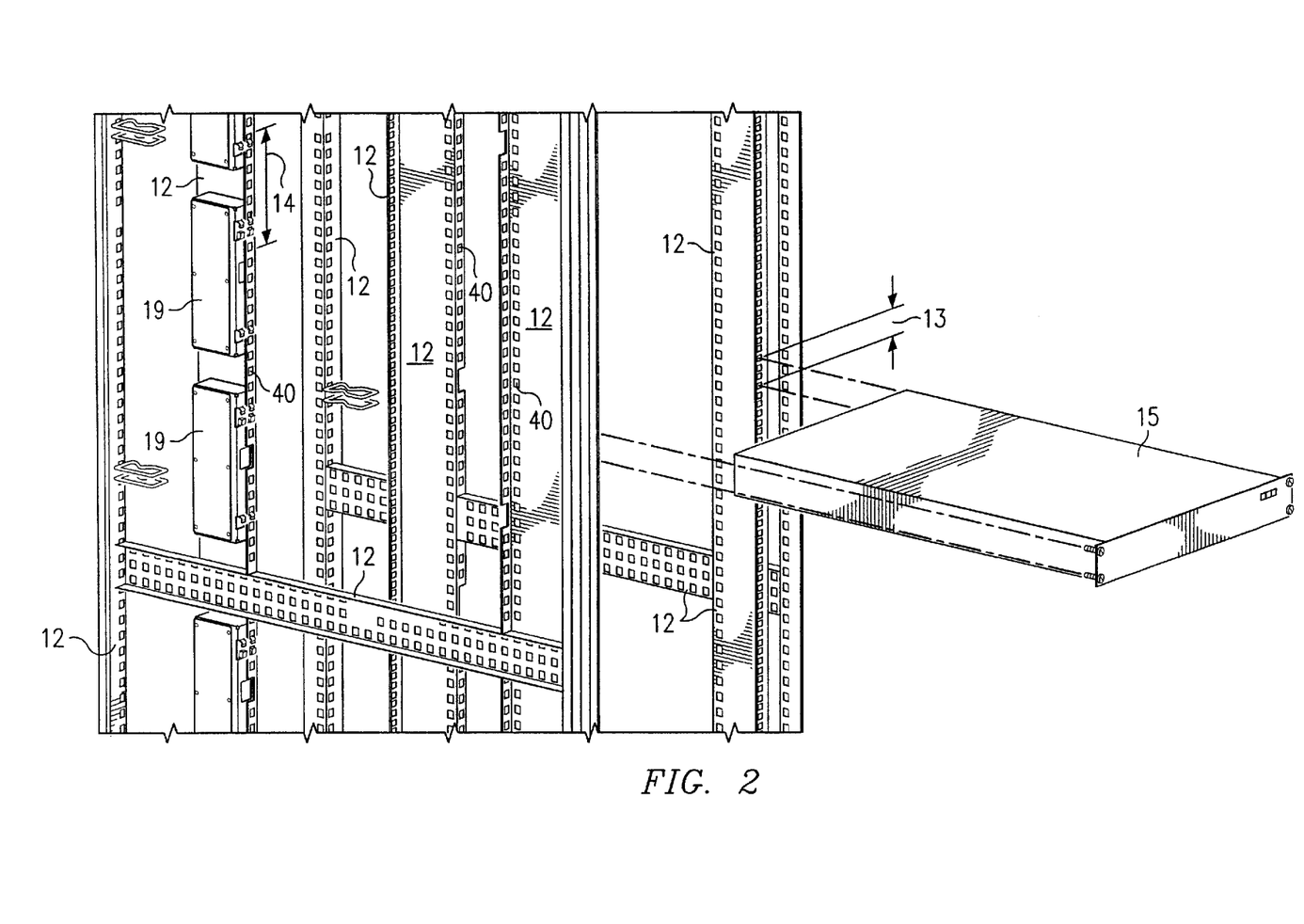
FIG. 2 illustrates an exploded view of a component installed in the U space of the rack, with portions removed.

FIG. 2 illustrates a perspective view of an example embodiment of rack rails 12, with portions removed, depicting different standard interfaces for mounting components 15 in rack 10. Each rack rail 12 includes at least one standard interface used to attach a variety of components 15 to rack 10. Typically, a standard interface includes a repeating pattern or common connection points or apertures to facilitate the attachment of devices such as component 15 to rack 10. In the present embodiment, rack rails 12 may include a first standard interface that conforms to an Electronic Industry Association (EIA) standard such as EIA standard RS-310 for mounting component 15 in rack 10.

Rack 10 includes at least two sets of rack rails 12 that include interfaces that conform to an EIA RS-310 standard. This standard defines vertical spacing of the rack into 1.75 inch increments, also known as "U's". Each U 13 consists of three mounting apertures. Also in accordance with the EIA RS-310 standard, the distance between a pair of rack rails 12 is typically at nineteen (19) inches. Components 15 are often sized according to the number of U's within a rack they will require, such as a 1U server.

Racks may further be defined according to the number of U's that correspond to the height of the EIA RS-310 interface portion of the rack, such as a 24U rack, 42U rack or other suitable multiple. For example, a 42U rack may be an enclosed rack having forty-two 1.75-inch spaces for attaching components 15.

Each U location 13 on rack rail 12 may include three mounting points for attaching a component 15 (or an arm or slide component formed to support component 15) to rack rail 12. For the purposes of this disclosure, the interior space within rack 10 that may house component 15 and support by first standard interface 13 is defined to be dedicated interior space or U-space. Rack rails 12 may further include second standard interface 14 for providing attachment locations for various hardware and components 19 to be placed in rack 10. Second standard interface 14 may be used to attach components in areas within the rack but not associated with the dedicated rack space. Thus, rails 12 also include second standard interface 14 for mounting components 19 in non-dedicated or non-U space within rack 10. In the present embodiment, second standard interface 14 is a twenty-five millimeter pitch interface that provides interface openings 40 at twenty-five millimeter intervals. In alternative embodiments, another suitable standard interface may be used.

FIG. 3 illustrates a cross-sectional view of rack 10 showing an example embodiment of dedicated space 24 and non-dedicated space 25. First standard interface 13 (as shown in FIG. 2) defines dedicated space or U-space 24, for disposing components 15 within rack 10. Because components 15 often do not extend to the entire depth of rack 10, a zero-U space or non-dedicated space 25 may remain behind component 15. Additional non-dedicated space includes areas on the sides, bottom, and top of rack 10. In some instances this space may be used for routing cables or permitting various electrical interconnections between components 15 and 19. However, in other instances, components 19 may be installed in non-dedicated space 25. In operation, any remaining space in rack 10 not occupied by a component 15 may be considered to be non-dedicated space 25.

Figure 4:
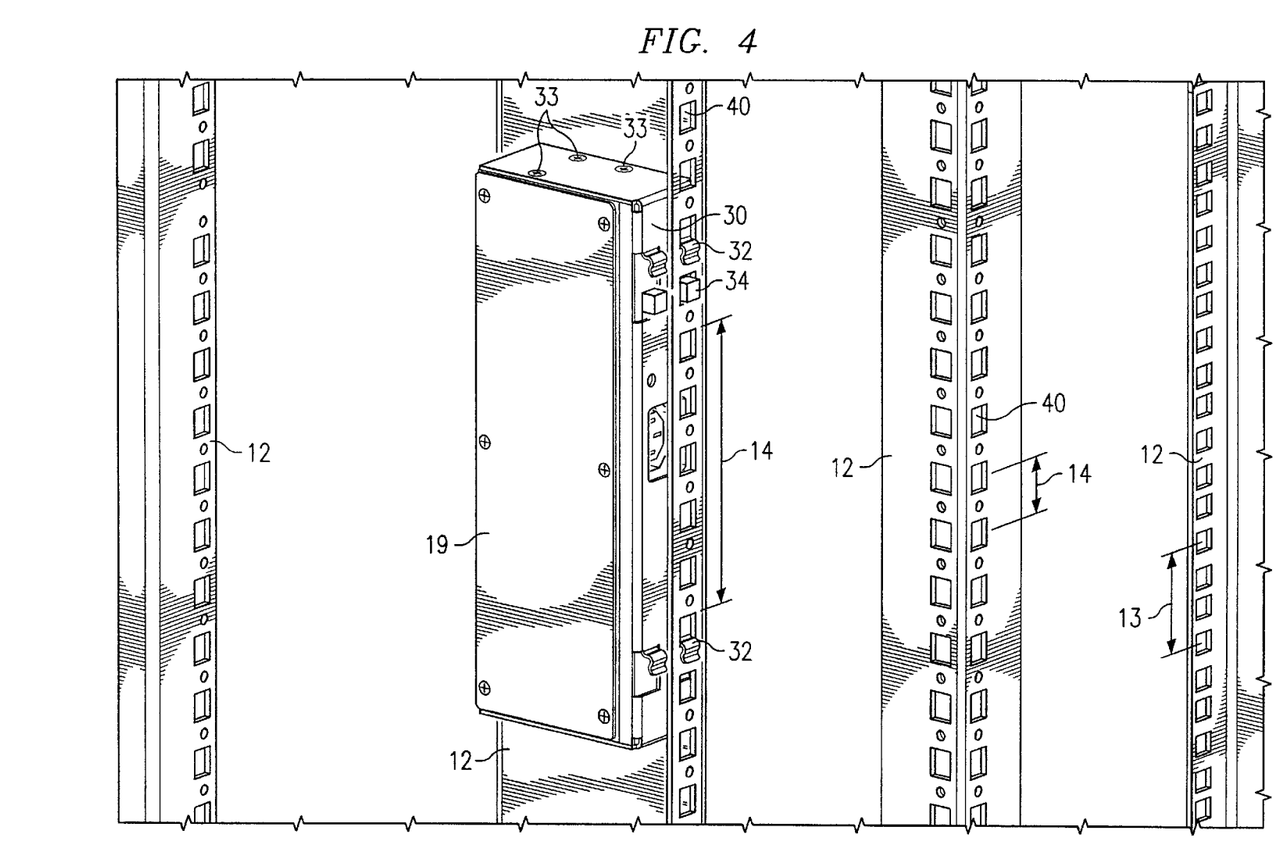
FIG. 4 illustrates a perspective view of an example embodiment of a component bracket coupled to a component mounted in the non-dedicated space of a rack.

Further, an exterior housing (not expressly shown), which may surround rack rails 12, may provide additional non-dedicated space 25 within rack 10. For example, non-dedicated space 25 may include the space between a frame support and a panel enclosure. FIG. 4 illustrates a perspective view of component bracket 30 coupled to component 19 mounted in non-dedicated space 25 of rack 10. Component bracket 30 may be coupled to component 19 for attaching to interface opening 40 located in rack rail 12. Component bracket 30 may be retained in rack 10 by engaging hook 32 to interface opening 40 and using latch mechanism 34 to prevent disengagement of hook 32 from rack rail 12.

In the present embodiment, component bracket 30 engages a portion of rack rail 12 to hold component 15 within non-dedicated space 25. By placing component 19 within non-dedicated space 25, U space 24 in rack 10 may be populated with other information handling components. For example, a power distribution unit (PDU) may be coupled with component bracket 30 for placement in non-dedicated space 25, thus permitting additional servers to be placed in the U space of rack 10.

Typically components 19 installed in non-dedicated space 24 may include peripherals, fans, power distribution units, switches, routers, or any other suitable component for placing in non-dedicated space 25. In the present embodiment, several power distribution units are located along rack rail 12 in non-dedicated space 24 to provide multiple electrical outlets for components 15 and installed in either U space 24 or non-dedicated space 25.

Figure 5:
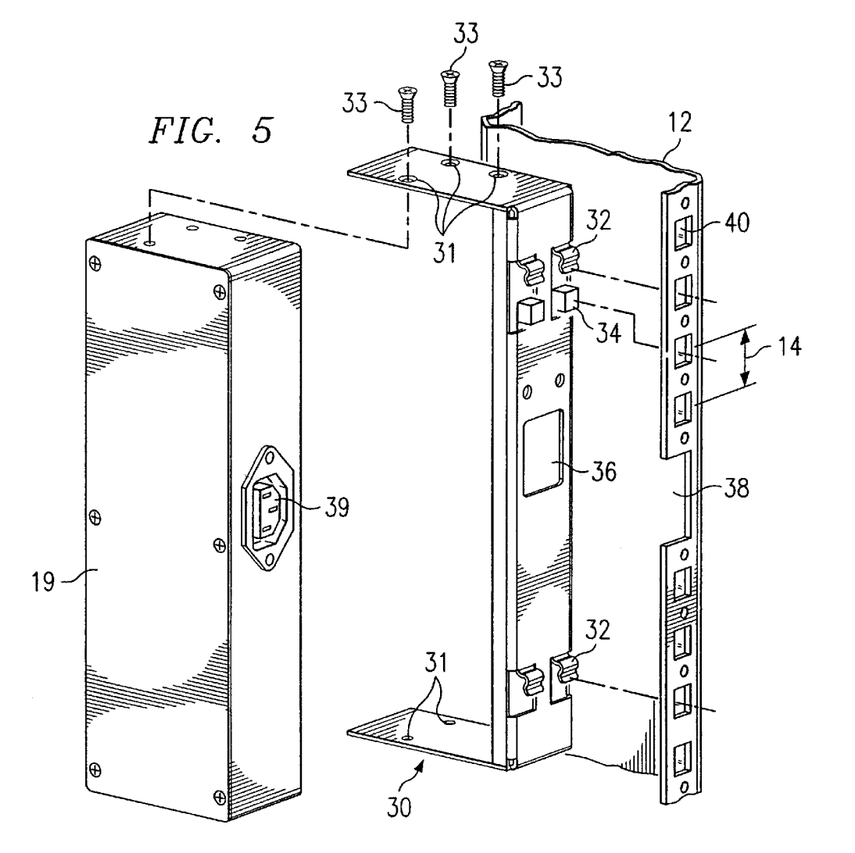
FIGS. 5 and 6 illustrate exploded views of an example embodiment of a component bracket attaching an component to an interface opening in a non-dedicated space of a rack.
Figure 6:
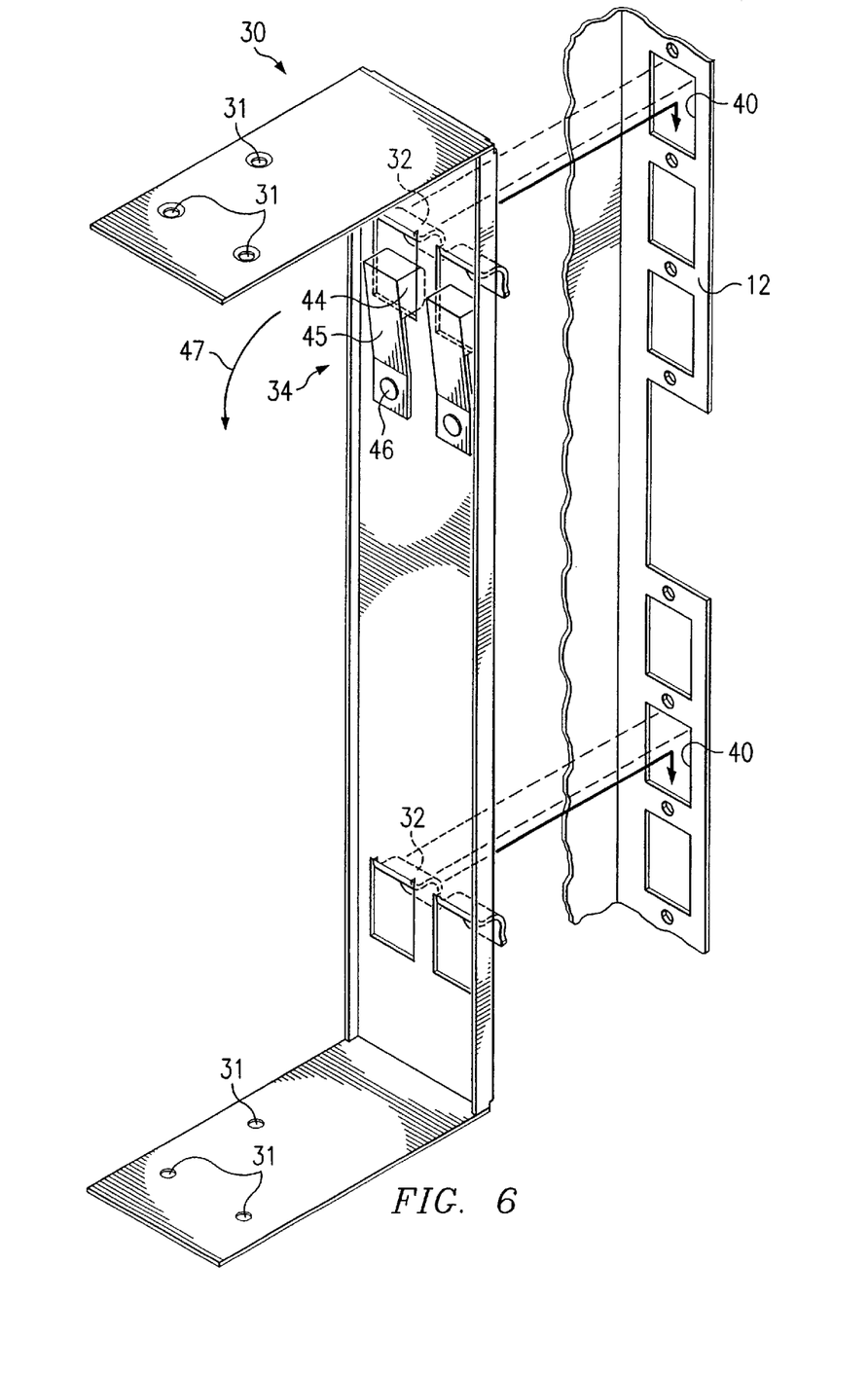

FIGS. 5 and 6 illustrate exploded views of an example embodiment of component bracket 30 used for attaching component 19 to interface opening 40 in non-dedicated space 25 of rack 10. Component bracket 30 is formed to couple to a an appropriate standard interface. In the present embodiment, component bracket 30 is formed to couple to second standard interface 14. Typically, component bracket 30 may be formed from a similar material as rack rail 12, but may be formed from any suitable material operable to support component 19. In one embodiment, component bracket 30 may be stamped and shaped from thin-gauge steel.

In the present embodiment, component bracket 30 attaches to component 19 using fasteners 33. In the present embodiment, component bracket 30 may include apertures 31 with threaded screws 33 for attaching component bracket 30 to component 15. In other embodiments, component bracket 30 may be coupled to component 19 by other suitable fasteners. In an alternate embodiment, component bracket 32 may be integrated into the exterior housing of component 19.

Component bracket 30 preferably includes hook 32 and latching mechanism 34. Hook 32 extends out from component bracket 30 in the opposite direction from attached component 19 to engage second interface 14. In the present preferred embodiment, hook 32 may extend from component bracket 30 in a downward-facing, generally L-shaped configuration such that hook 32 extends through and engages rack rail 12 at interface opening 40 to mount component 15 in place.

In the present embodiments, component bracket 30 includes more than one hook 32 for attaching component bracket 30 to second interface 14. In alternative embodiments, component bracket may include only a single hook. The present embodiments also provides for a dual set of hooks, disposed side-by-side to allow for alternate attachment orientations for component bracket 30 with respect to interface 14. Specifically, the dual set of attachment hooks 32 permits component bracket 30 to utilize non-dedicated space on either side of rack 10. For example, component bracket 30 may be formed with two sets of symmetrical hooks 32 to provide for a left side attachment or a right side attachment using two hooks 32 for each side at one time.

Latch mechanism 34 is preferably included for attaching component bracket 30 to interface 14. Specifically, latch 34 prevents hook 32 from disengaging from interface opening 40 while latch 34 is engaged with interface 14. When latch 34 is disengaged from interface 14, hook 32 may be un-hooked, thereby allowing removal of component bracket 30 from rail 12. Thus, latch mechanism 34 allows component bracket 30 to be detachably coupled to rack rail 12. In certain embodiments, hook 32 engages opening 40 by sliding along rack rail 12.

The sliding motion adjacent rail 12 depresses the latch mechanism until the latch is adjacent to an interface hole 40.

Hook 32 is space apart from latch mechanism 34 such that as hook 32 engages an opening 40, latch mechanism 34 may automatically engage another opening 40 along rack rail 12. In this manner, latch mechanism 34 secures the one or more hooks 32 of component bracket 30 to rail 12 until latch mechanism 34 is depressed to allow for removal.

In one example embodiment, as illustrated in FIG. 6, latch mechanism 34 may be coupled to component bracket 30 with rivet 46. Latch mechanism may further include longitudinal spring 45 attached to stop 44.

Depressing stop 44 in direction of arrow 47 may allow for component bracket 30 to freely slide along rack rail 12 permitting attachment to or removal from rack rail 12. However, by sliding component bracket 30 against rack rail 12, as depressed stop 44 is positioned adjacent to opening 40, longitudinal spring 45 applies force to stop 44, thereby positioning stop 44 into opening 40 and substantially preventing further movement of component bracket 30 with respect to rail 12. By designing hook 32 and latch mechanism 34 for use with second standard interface 14, stop 44 may protrude into second opening 40 as hook 32 engages first opening 40 of rack rail 12. Thus, stop 44 in combination with longitudinal spring 45 may prevent hook 32 from disengaging rack rail 12. In other embodiments, latch mechanism 34 may engage any suitable portion of rack 10 to prevent hook 32 from being removed from interface opening 40.

Because component bracket 30 may be formed over one or more sides of component 15, component bracket 30 may include bracket opening 36 to provide expose a section of component 19. Bracket opening 36 may be formed as notch or other suitable opening to expose a part of component 19. The exposed portion of component 19 may be used to access component 19 for tasks including inspecting or attaching a device to component 19. In one example embodiment, exposing a section of component 19 may permit the connection of an electrical cable to component port 39 of component 19. Component port 39 may include a connection for an electrical cable, a communications port, or a power cable.

Typically, when mounted in rack 10, component bracket 30 is placed against rack rail 12 such that it prevents access to a portion component 19. In the present embodiment, rack rails 12 may include a rack relief 38 formed in the rails. Rack relief 38 may provide access to component 15 via bracket opening 36 while attached to rack 10. Rack relief 38 may include any opening, notch, break, deviation, or any suitable void length of rail member that allows access to component 15. In certain embodiments, rack relief 38 may include a notch that may align with bracket opening 36 to permit cables such as power cables or communication cables to be attached at component port 39.

Figure 7:
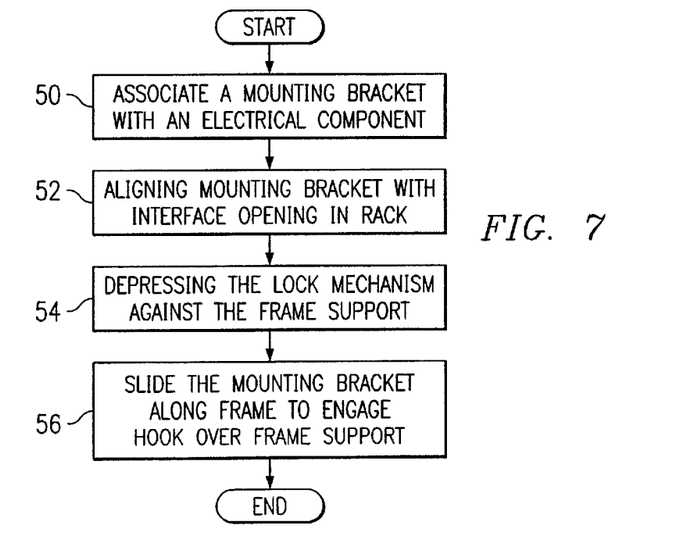
FIG. 7 illustrates a flowchart for attaching an component to a rack rail in a non-dedicated space of a rack.

FIG. 7 illustrates a flowchart for attaching component 15 to rack rails 12 in non-dedicated space 25 of rack 10. At step 50, component 15 may be associated with component bracket 30 for placement in rack 10 containing a plurality of rack rails 12. Component bracket 30 may be attached to component 15 such that the orientation of component 15 in rack 10 remains in non-dedicated space 25 when mounted to rack rails 12.

At step 52, component bracket 30 may be aligned with first interface opening 40 in rack 10. Component bracket 30 including hook 32 and latch mechanism 34 may be placed in alignment with second standard interface 14 such that one or more hooks 32 may protrude into rack rail 12 at one or more respective interface openings 40. In the present embodiment, interface opening 40 is be formed according to a standard pitch spacing such as a twenty-five millimeter pitch spacing. Component bracket 30 aligns with rack rail 12 such that component 19 is wholly placed within non-dedicated space 25 of rack 10.

At step 54, component bracket 30 with attached component 19 may be positioned adjacent to rack rail 12, allowing hook 32 to extend through first interface opening 40. In certain embodiments where component bracket 30 includes more than one hook 32, component bracket 30 is positioned to engage the more than one hook in openings 40. With respect to embodiments that include dual sets of one or more hooks, disposed side-by-side to facilitate alternate positioning of component bracket, only a single set of one or more hooks 34 is engaged with rail 12 at any given time.

Positioning component bracket 30 against rack rail 12 permits latch mechanism 34 to depressed into a retracted position.

At step 56, component bracket 30 preferably slides adjacent to rack rail 12 to engage hook 32 with interface opening 40. With hook 32 engaged with rack rail 12, longitudinal spring 45 urges stop 44 into another opening 40. Component 19 and component bracket are then substantially secured to rack rail 12.

Once latch mechanism 34 engages rack 10, component bracket 30 may be retained in position until latch mechanism 34 is released to allow component bracket 30 to slide. In the previous example embodiment, stop 44 of latch mechanism 34 may be depressed until stop 44 is retracted from second interface opening 40. With component bracket 30 free to slide, component bracket 30 may be disengaged rack rail 12.

Although the present disclosure has been described with respect to a specific embodiment, various changes and modifications will be readily apparent to one skilled in the art. The present disclosure is not limited to the illustrated embodiment, but encompasses such changes and modifications that fall within the scope of the appended claims.

What is claimed is:

1. An information handling system having a rack operable to mount information handling system components therein, the rack comprising:

a plurality of rack rails connected with a top support and a bottom support and defining a rack space, the plurality of rack rails having a first standard interface and a second standard interface;

the first standard interface operable to facilitate the housing of information handling system components within a dedicated portion of the rack space;

the second standard interface operable to facilitate the housing of at least one information handling system component within an non-dedicated portion of the rack space;

a component bracket detachably coupled to a selected portion of the second standard interface of a rack rail, the component bracket operable to support an information handling system component within a portion of the non-dedicated portion of the rack space; and the component bracket comprising at least one hook and at least one latch mechanism operable to tool-lessly secure the component bracket to the second standard interface.

2. The information handling system of claim 1, further comprising the at least one hook extending from the component bracket to the selected portion of the second standard interface of a rack rail having a downward-facing, generally L-shaped configuration.

3. The information handling system of claim 1, further comprising the information handling system component selected from the group consisting of a power distribution unit (PDU), a switch, a router, a peripheral device, a cable management device, and a server.

4. The information handling system of claim 1, wherein the second standard interface further comprises a twenty-five millimeter pitch spacing-type interface.

5. The information handling system of claim 1, wherein the at least one latch mechanism releasably engages a first portion of the second standard interface and the at least one hook engages a second portion of the second standard interface.

6. The information handling system of claim 5, wherein:
the latch mechanism comprises a stop disposed upon a longitudinal spring;
the longitudinal spring operable to position the stop in engagement with the first portion of the second standard interface; and
the longitudinal spring further operable to disengage the stop from the second standard interface.

7. The information handling system of claim 1, wherein the component bracket further comprising a second hook operable to secure the component bracket to the second standard interface in cooperation with the at least one hook.

8. The information handling system of claim 1, wherein the component bracket further comprises a second hook and a second latch mechanism, the second hook and the second latch mechanism operable to allow the component bracket to be reversibly installed.

9. The information handling system of claim 1, further comprising:
an opening formed in the component bracket, the opening operable to access a portion of the information handling system component; and
a relief formed in the plurality of rack rails;
whereby the relief substantially aligns with the opening and provides access to the exposed portion.

10. The information handling system of claim 9, wherein the portion comprises a port on the information handling component.

11. A component bracket for utilizing non-dedicated rack space, comprising:
a frame operable to retain a computer component and further operable to mount the computer component in a non-dedicated rack space, a bracket opening formed within the frame operable to access a component port associated with the computer component;
at least one hook formed on the frame, the hook operable to engage a second standard interface of a rack rail having a first standard interface operable to secure components stored within a dedicated rack space and the second standard interface operable to secure components within the non-dedicated rack space; and
a depressible latch coupled to the frame, the latch operable to secure the frame to the second standard interface such that the at least one hook remains engaged with the second standard interface.

12. The component bracket of claim 11, further comprising the depressible latch operable to engage the second standard interface.

13. The component bracket of claim 12, wherein the depressible latch comprises a spring loaded latch assembly.

14. The component bracket of claim 12, wherein;
the second standard interface comprises a twenty-five millimeter pitch spacing interface; and
the first interface comprises an EJA RS-310 interface.

15. The component bracket of claim 11, further comprising the hook extending from the frame to the first standard interface hole formed in the non-dedicated space of the rack having a downward-facing, generally L-shaped configuration.

16. The component bracket of claim 11, wherein the frame comprises a material selected from the group consisting of metal, glass, polymer, plastic and any combination thereof.

17. A method for utilizing non-dedicated rack space, the method comprising:
providing a computer component coupled to a mounting bracket, the mounting bracket including at least one hook and a latching mechanism;
aligning the mounting bracket with a first interface hole of a rack rail in a non-dedicated space of a rack;
placing the mounting bracket against the rack rail such that the at least one hook protrudes through the first interface hole; and
securing the mounting bracket to the rack rail by sliding the bracket along the rack rail until the hook releasably engages the rack rail and the latching mechanism tool-lessly and releasably engages a second interface hole in the rack rail.

18. The method of claim 17, further comprising placing the mounting bracket over a relief in the rack rail such that an opening in the mounting bracket aligns with the relief to provide access to a portion of the computer component.

19. The method of claim 17, further comprising designing the mounting bracket to include a second hook and a second latching mechanism such that the
mounting bracket may be reversibly installed.

* * * * *